United States Patent
Hayakawa et al.

(10) Patent No.: US 7,952,446 B2
(45) Date of Patent: May 31, 2011

(54) MICROCOMPUTER HAVING CPU AND PWM TIMER

(75) Inventors: Tomoharu Hayakawa, Kasugai (JP); Hiroyuki Morita, Kariya (JP); Hitoshi Ishikawa, Tokyo (JP); Tatsuya Aizawa, Tokyo (JP); Yu Takeuchi, Tokyo (JP)

(73) Assignee: Denso Corporation, Kariya (JP)

( * ) Notice: Subject to any disclaimer, the term of this patent is extended or adjusted under 35 U.S.C. 154(b) by 197 days.

(21) Appl. No.: 12/470,296

(22) Filed: May 21, 2009

(65) Prior Publication Data
US 2009/0292936 A1   Nov. 26, 2009

(30) Foreign Application Priority Data
May 23, 2008   (JP) .................................. 2008-135312

(51) Int. Cl.
*H03K 7/08* (2006.01)
(52) U.S. Cl. ........................................ 332/109; 375/238
(58) Field of Classification Search .................. 332/109; 375/238
See application file for complete search history.

(56) References Cited

U.S. PATENT DOCUMENTS

| | | | |
|---|---|---|---|
| 7,583,158 B2 * | 9/2009 | Makita et al. | 332/109 |
| 2003/0001686 A1 | 1/2003 | Sekiya | |
| 2005/0190005 A1 * | 9/2005 | Katsuki et al. | 332/109 |
| 2006/0055483 A1 * | 3/2006 | Berger et al. | 332/109 |

FOREIGN PATENT DOCUMENTS
JP   06-083985   3/1994
* cited by examiner

*Primary Examiner* — Joseph Chang
(74) *Attorney, Agent, or Firm* — Nixon & Vanderhye PC

(57) ABSTRACT

A microcomputer includes: a CPU executing a predetermined calculation process; and a PWM timer generating a PWM pulse. The PWM timer includes a RAM for storing a duty value of the PWM pulse and a PWM controller for generating the PWM pulse. The PWM controller includes a PWM counter for counting up from a predetermined value as an initial value. The PWM pulse has an unit waveform, which is generated based on comparison between the duty value of the RAM and an output value of the PWM counter. The RAM outputs a new duty value at every comparison without functioning the CPU so that the duty value of the PWM pulse is changed in chronological order.

13 Claims, 12 Drawing Sheets

| FIG. 2A | FIG. 2B |
|---|---|

MICROCOMPUTER HAVING CPU AND PWM TIMER

CROSS REFERENCE TO RELATED APPLICATION

This application is based on Japanese Patent Application No. 2008-135312 filed on May 23, 2008, the disclosure of which is incorporated herein by reference.

FIELD OF THE INVENTION

The present invention relates to a microcomputer having a PWM timer.

BACKGROUND OF THE INVENTION

A PWM (i.e., pulse width modulation) method is a modulation method for modulating and changing a duty ratio of a pulse wave. In a microcomputer (e.g., a micro controller, a micro processor or the like), a PWM timer generates a PWM pulse wave.

The patent document No. 1 teaches technique that content of a data for setting a duty ratio is monitored by a hard ware so that an active level of the PWM signal is controlled. Thus, load of a soft ware is reduced. This technique shows that the duty ratio is defined by a value in a lower limit setting register when a value set in a compare register is smaller than the value in the lower limit setting register, and the duty ratio is defined by a value in an upper limit setting register when the value set in the compare register is larger than the value in the upper limit setting register. Thus, the duty ratio is output as a duty ratio signal. In this case, it is not necessary to monitor with using the soft ware since the duty ratio is monitored with using the hard ware.

Further, the patent document No. 2 teaches a pulse width modulator for outputting a PWM signal synchronized with a reference clock.

[Patent document No. 1] JP-A-H06-083985
[Patent document No. 2] JP-A-2003-11410

A peripheral function element (i.e., a peripheral circuit module) is mounted on a microcomputer such as a general timer including a PWM timer, a SCI (i.e., serial communication interface) and a CAN (controller area network). In the peripheral function element, it is necessary to set a certain value in a control register having the peripheral function element by writing from a central processing unit (i.e., CPU). The present inventors have studied about the above technique. The present inventors find out that a bus traffic in the CPU is overloaded so that a temporally trap of writing function in the CPU may be occurred. When the trap is occurred, the CPU cannot control the PWM sufficiently, so that a normal PWM pulse is not output. Further, it is considered that interruption of the CPU is performed to update the duty value. However, the present inventors find out that the normal PWM pulse may not be output when failure of an interruption signal caused by a soft ware error or breakdown of the hard ware occurs. This provides reduction of reliability of a system.

SUMMARY OF THE INVENTION

In view of the above-described problem, it is an object of the present disclosure to provide a microcomputer having a PWM timer. In the microcomputer, reliability of generation of a PWM pulse is improved.

According to an example aspect of the present disclosure, a microcomputer includes a CPU for executing a predetermined calculation process and a PWM timer for generating a PWM pulse. The PWM timer includes a RAM for storing a duty value of a PWM pulse and a PWM controller for generating the PWM pulse. The PWM controller includes a PWM counter for counting up from a predetermined value as an initial value. A unit waveform of the PWM pulse is generated based on comparison between the duty value in the RAM and an output value of the PWM counter. Another duty value at each comparison is output from the RAM without functioning the CPU, so that the duty value of the PWM pulse is changed in time sequence manner.

Thus, when the PWM pulse is generated, influence of the overload of the bus traffic in the CPU is avoided, so that temporally trap of writing function in the CPU is avoided. Accordingly, in the microcomputer, the reliability of generation of the PWM pulse is improved.

According to a second aspect of the present disclosure, a microcomputer includes a CPU for executing a predetermined calculation process and a PWM timer for generating a PWM pulse. The PWM timer includes a RAM for storing a duty value of a PWM pulse, a plurality of PWM controllers for generating the PWM pulse, and a port for outputting the PWM pulse generated in the multiple PWM controllers to an external circuit. Each PWM controller includes a PWM counter for counting up from a predetermined value as an initial value. A unit waveform of the PWM pulse is generated based on comparison between a duty value in the RAM and an output value of the PWM counter. Another duty value at each comparison is output from the RAM without functioning the CPU, so that the duty value of the PWM pulse to be output to the external circuit is changed in time sequence manner.

Thus, when the PWM pulse is generated, influence of the overload of the bus traffic in the CPU is avoided, so that temporally trap of writing function in the CPU is avoided. Accordingly, in the microcomputer, the reliability of generation of the PWM pulse is improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Example embodiments of the present invention will be explained as follows.

Figure 9:
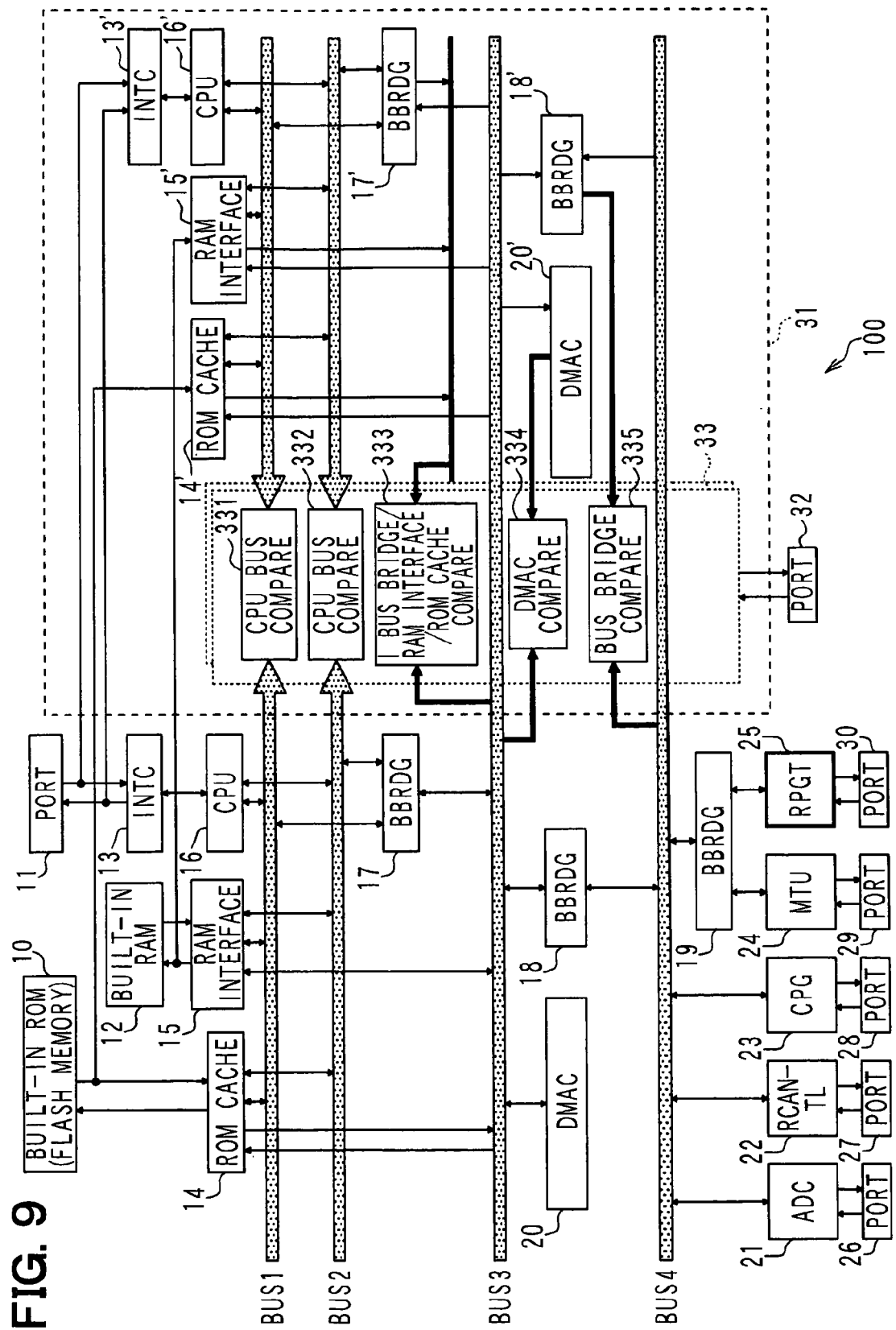
FIG. 9 is a block diagram showing detail of the other main part of the microcomputer.

FIG. 9 shows an example structure of a microcomputer according to the present invention.

The microcomputer 100 shown in FIG. 9 may be formed on one semiconductor substrate such as a single crystal silicon substrate by a conventional semiconductor integrated circuit manufacturing technique although a manufacturing method is not limited particularly. The microcomputer 100 includes a built-in ROM (i.e., read only memory) 10, a built-in RAM (i.e., random access memory) 12, an interruption controller (i.e., INTC) 13, a ROM cache memory 14, a RAM interface 15, a CPU (i.e., central processing unit) 16, bus bridges (BBRUDG) 17, 18, 19, a direct memory access controller 20, an A/D converter (ADC) 21, a controller area network (CAN) 22, a clock oscillator (CPG) 23, a multi function timer pulse unit (MTU) 24, a reload pattern generation timer (RPGT) 25 and a duplication system diagnosis element 31 although elements in the microcomputer 100 are not limited particularly.

The built-in ROM 10 stores a program to be executed in the CPU 16. The built-in ROM 10 is formed from a flash memory. The ROM cache memory 14 is coupled with a CPU bus (fetch bus) BUS1, a CPU bus (memory access bus) BUS2 and an inside bus BUS 3. The ROM cache memory 14 stores data, which is frequently used, so that the number of times to access the built-in ROM 10 is reduced. The CPU 16 is capable of executing a predetermined process with performing the program stored in the built-in ROM 10. The built-in RAM 12 is coupled with the CPU buses BUS1, BUS2 and the inside bus BUS3 via the RAM interface 15. The built-in RAM 12 functions as a working area of the processing in the CPU 16. The interruption controller 13 is arranged to interrupt the CPU 16 from outside. The interruption controller 13 controls interruption of the CPU 16 based on NMI (i.e., non-maskable interrupt) and IRQ (i.e., interrupt request), which are input via an external terminal and a port 11 connecting to the external terminal. The CPU busses BUS1, BUS2 is coupled with the inside bus BUS3 via the bus bridge (BBRDG) 17. The inside bus BUS3 is coupled with a periphery bus BUS4 via a bus bridge (BBRDG) 18. The inside bus BUS3 is also coupled with a DMAC 20. The DMAC 20 transmits data between memories without functioning the CPU 16. The periphery bus BUS4 is coupled with an ADC 21, a RCAN-TL 22, a CPG 28, a MTU 24 and a RPGT 25. An analog signal is input in the ADC 21 via the external terminal and the port 21 connecting to the external terminal, and the ADC 21 converts the analog signal to a digital signal. The CAN 22 communicates various information in a control area network via an external terminal and a port 27 connecting to the external terminal. The CPG 23 is coupled with a quartz oscillator via a port 28 and an external terminal connecting to the port 28. The CPG 23 generates a clock signal having a predetermined frequency. The MTU 24 inputs and outputs various timer pulses via a port 29 and an external terminal connecting to the port 29. The RPGT 25 is a PWM timer for changing a duty periodically. Specifically, the RPGT 25 changes the duty of the PWM pulse waveform to be output to an outside via a port 30 and an external terminal connecting to the port 30 periodically in a chronological manner by setting and using a certain duty value pattern in a latter described duty value RAM. The MTU 24 and the RPGT 25 are coupled with the periphery bus BUS4 via the bus bridge (BBRDG) 19. Although there is no limitation, a clock frequency of the periphery bus BUS4 is, for example, 40 MHz. The MTU 24 and the RPGT 25 function with a clock frequency of 80 MHz in order to increase resolution, for example. Accordingly, in the bus bridge 19, frequency conversion is performed in order to adjust a bus cycle.

The duplication system diagnosis element 31 executes duplication system diagnosis so that improvement of reliability of processing in the microcomputer 100 is obtained. The duplication system diagnosis element 31 includes function modules having the same function as and corresponding to the built-in ROM 10, the built-in RAM 12, the interruption controller 13, the ROM cache memory 14, the RAM interface 15, the CPU 16, the bus bridges 17, 18, 19, and the DMAC 20 so that the duplication system diagnosis element 31 includes a built-in ROM 10', a built-in RAM 12', an interruption controller 13', a ROM cache memory 14', a RAM interface 15', a CPU 16', bus bridges 17', 18', 19', and a DMAC 20'. Further, to execute the duplication system diagnosis, the duplication system diagnosis element 31 includes a comparator 33 for comparing data in the CPU buses BUS1, BUS2, the inside bus BUS3 and the periphery bus BUS4. The comparator 33 includes CPU bus comparing elements 331, 332, a comparing element 333 for an I bus bridge, the RAM interface and the ROM cache memory, a DMAC comparing element 334, and a bus bridge comparing element 335. Data comparison results of the comparator 33 are capable of outputting to an outside via a port 32, so that the results are reflected on a user system, in which the microcomputer 100 is mounted. When the data comparison results of the comparator 33 are completely coincident with each other, the microcomputer 100 executes the processing properly. However, when the data comparison results of the comparator 33 are not completely coincident with each other, the processing in the microcomputer 100 may include and error. When the error is detected, the microcomputer 100 is controlled so as to switch the operation of the microcomputer to normal operation. For example, the microcomputer is reset, an interruption request is input to the CPU, or reset instruction is performed when the error occurs more than a predetermined number of times. By executing the duplication system diagnosis, the reliability of the user system is improved.

Figure 1:
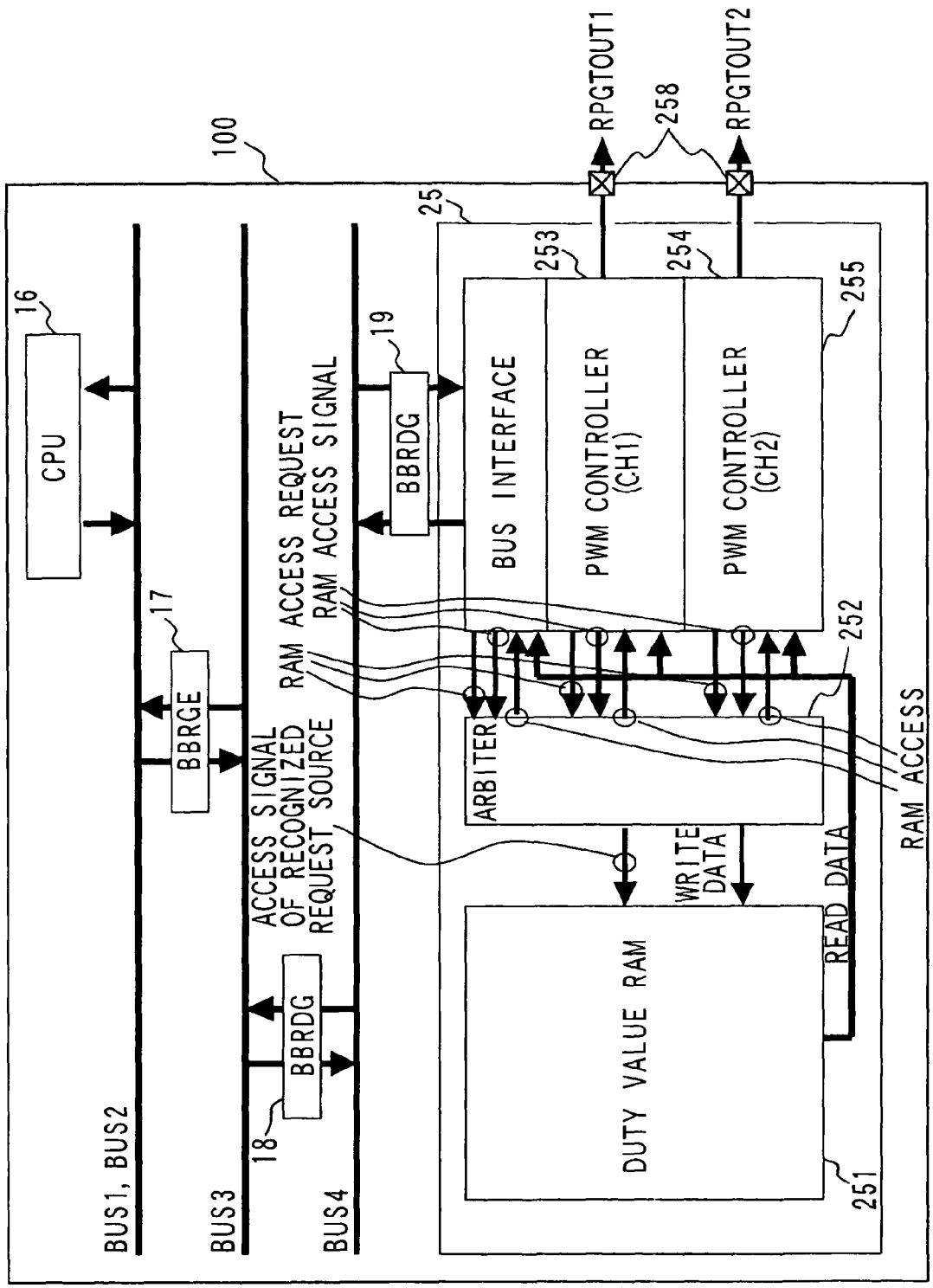
FIG. 1 is a block diagram showing a main part of a microcomputer according to the present invention.

FIG. 1 shows a main part of the RPGT 25 in the microcomputer 100. The RPGT 25 includes a duty value RAM 251, an arbiter 252, a bus interface 235, a PWM controller (CH1) 254, and another PWM controller (CH2) 255 although elements in the RPGT 25 are not limited. A certain duty value pattern is set in the duty value RAM 251. As described latter, the PWM controller 254 and the other PWM controller 255 include a PWM counter for counting up from a predetermined set value as an initial value, respectively. Further, the PWM controller 254 and the other PWM controller 255 include one or more external terminals 258 for outputting the PWM pulse to an outside of the microcomputer, respectively. The unit waveform of the PWM pulse is generated based on the compare match between the duty value in the duty value RAM 251 and the output value of the PWM counter. A new duty value is downloaded from the duty value RAM 251 at each compare match without functioning the CPU 16. Thus, time series variation of the duty value of the PWM pulse can be performed. In the example constitution shown in FIG. 1, since the PWM controllers provide two channels (CH1, CH2), two types of PWM outputs (RPGTOUT1, RPGTOUT2) capable of performing time series variation of the duty value are obtained. The bus interface 235 is coupled with the periphery bus BUS 4 via the bus bridge 19. Various information for controlling operation of the RPGT 25 is input in the RPGT 25 via the bus bridge 19. The arbiter 252 adjusts when RAM access requests from the bus interface 253 and the PWM controllers 254, 255 compete against each other. According to the access signal of a source of request recognized by the arbiter 252, the duty value pattern can be written in the duty value RAM 251, and the duty value can be read out from the duty value RAM 251.

Figures 2, 2A:
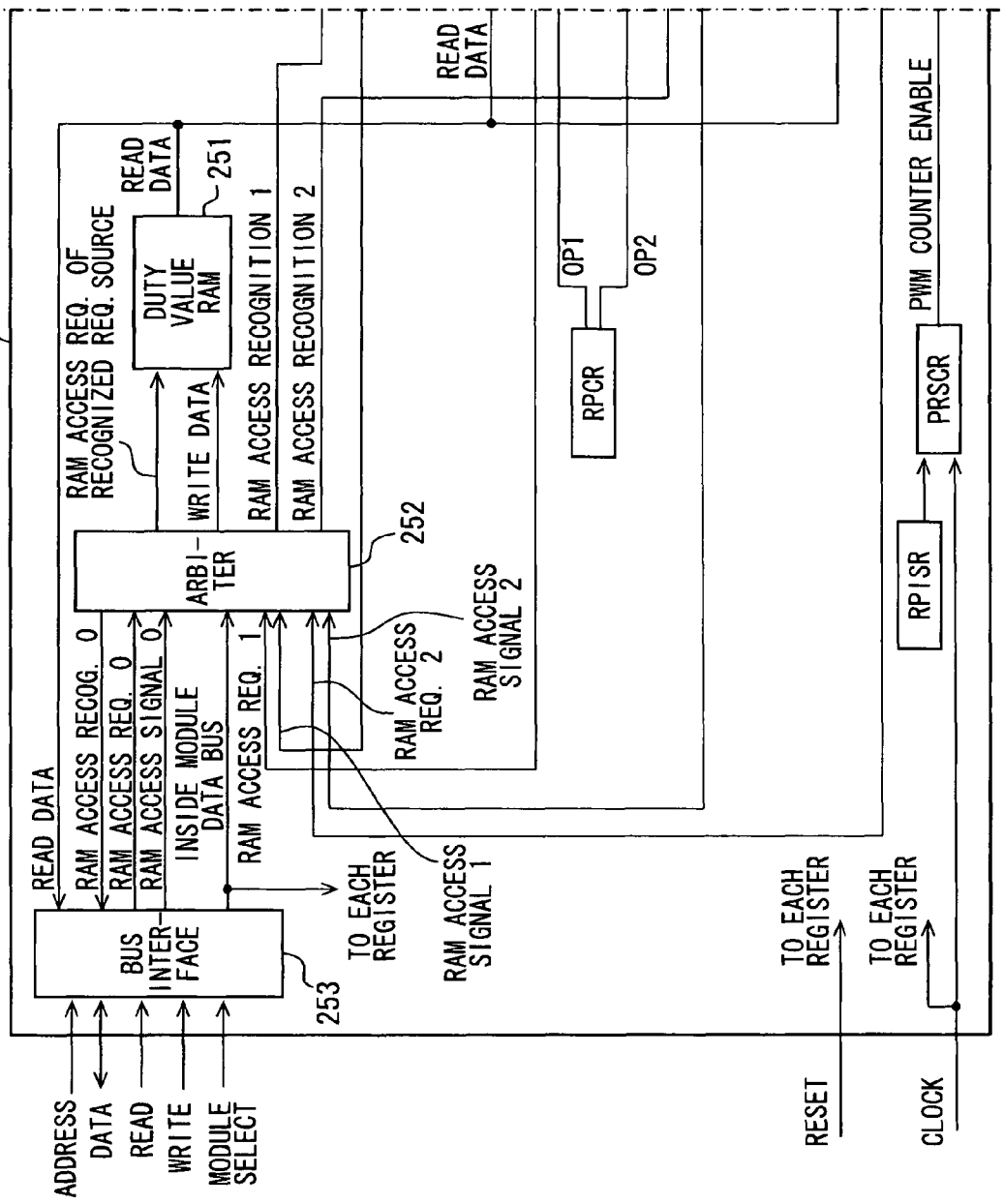
FIG. 2 is a block diagram showing detail of the main part of the microcomputer.
Figure 2B:
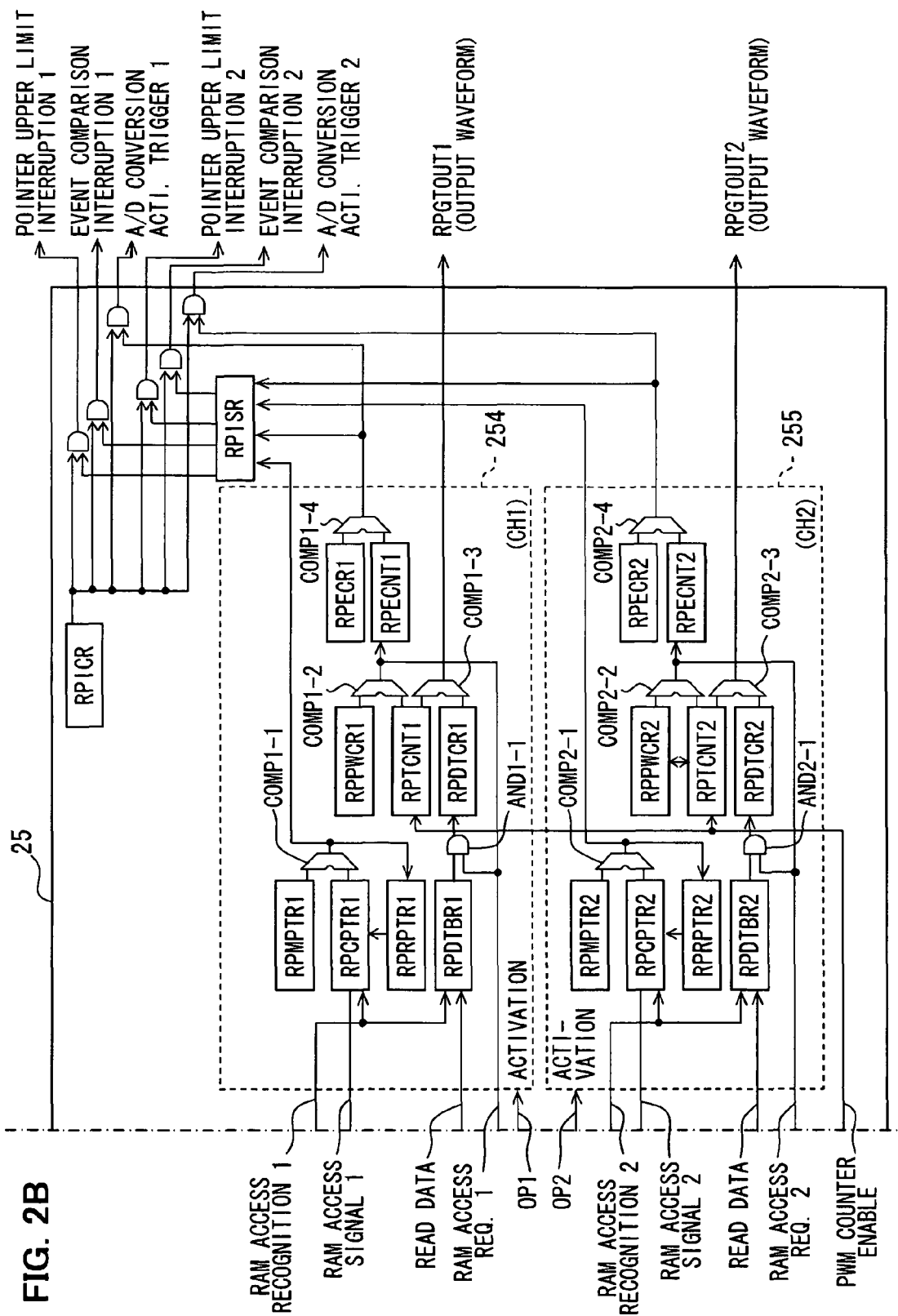

FIG. 2 shows further detailed example constitution of the RPGT 25.

Address information, a read signal, a write signal and a module select signal are input in the bus interface 253 via the periphery bus BUS 4 and the bridge 19. Further, the bus interface 253 can output certain data to the periphery bus BUS 4 via the bridge 19. When bus access recognition of "0" is input from the arbiter 253 to the bus interface 253 according to the RAM access request of "0" from the bus interface 253, the access signal of "0" for the duty value RAM 251 is output from the bus interface 253 to the arbiter 252. Thus, access from the bus interface 253 to the duty RAM 251 can be achieved. During the access from the bus interface 253 to the duty value RAM 251, the duty value pattern can be written in the duty value RAM 251. The writing task of the duty value pattern is performed by controlling the CPU when the microcomputer 100 is initialized. Further, when the bus access recognition of "1" is input from the arbiter 252 to the PWM controller 254 according to the RAM access request of "1" from the PWM controller 254, the access signal of "1" for the duty value RAM 251 is output from the PWM controller 254 to the arbiter 252. Thus, access from the PWM controller 254 to the duty value RAM 251 can be achieved. During the access from the PWM controller 254 to the duty value RAM 251, the duty value in the duty value RAM 251 is read in the PWM controller 254. Similarly, when the bus access recognition of "2" is input from the arbiter 252 to the PWM controller 255 according to the RAM access request of "2" from the PWM controller 255, the access signal of "2" for the duty value RAM 251 is output from the PWM controller 255 to the arbiter 252. Thus, access from the PWM controller 255 to the duty value RAM 251 can be achieved. During the access from the PWM controller 255 to the duty value RAM 251, the duty value in the duty value RAM 251 is read in the PWM controller 255.

Further, the RPGT 25 includes a RPGT control register RPCR, a prescaler PRSCR, a prescaler setting register RPISR, a RPGT event creation permission register RPICR, and a RPGT event status register RPISR. The RPGT control register RPCR is a register capable of memorizing bits OP1, OP2 for instructing operation start and operation stop of the PWM controllers 254, 255. When the CPU 16 writes a logic value of "1" in the bit OP1, the PWM controller 254 is activated. When the CPU 16 writes a logic value of "1" in the bit OP2, the PWM controller 255 is activated. When the CPU 16 writes a logic value of "0" in the bit OP1, the PWM controller 254 stops functioning. When the CPU 16 writes a logic value of "0" in the bit OP2, the PWM controller 255 stops functioning. The event creation permission register RPICR is a register for setting permission and prohibition of pointer upper limit interruption of "1 " and "2, " event comparison interruption of "1 " and "2, " and A/D conversion activation trigger of "1" and "2." The RPGT event status register RPISR stores the pointer upper limit interruption of "1" and "2" and the event comparison interruption of "1" and "2" output from the PWM controllers 254, 255. By obtaining logical AND operation between the output of the event creation permission register RPICR and the pointer upper limit interruption of "1 " and "2, " the event comparison interruption of "1 " and "2, " or the A/D conversion activation trigger of "1 " and "2" the permission and the prohibition are switched.

Next, the inner construction of the PWM controllers 254, 255 will be explained. Here, the PWM controllers 254, 555 have the same construction. Accordingly, only the construction of the PWM controller 254 will be explained. The detailed description of the PWM controller 255 will be skipped. Here, an element in the PWM controller 255 having the same function is defined as the same reference numeral as an element in the PWM controller 254. The element will be identified with suffixes of "1" and "2, " which correspond to the channels (CH1, CH2).

The PWM controller 254 includes a duty pointer upper limit register RPMPTR1, a duty pointer register RPCPTR1, a duty pointer reload register RPRPTR1, a duty buffer register RPDTBR1, a PWM period register RPPWCR1, a PWM counter RPTCNT1, a duty comparison register RPDTCR1, an event comparison register RPECR1, an event counter RPECNT1, a comparator COMP1-1, another comparator COMP1-2, another comparator COMP1-3, another comparator COMP1-4 and an AND gate AND1-1.

The duty pointer upper limit register RPMPTR1 stores the upper limit value of the duty pointer register RPCPTR1. The duty pointer register RPCPTR1 stores the pointer showing an address for providing an instruction to read the duty value from the duty value RAM 251. Based on the pointers the address signal (i.e., an access signal of "1") of the duty value RAM 251 is formed. Difference between the duty pointer upper limit register RPMPTR1 and the duty pointer reload register RPRPTR1 corresponds to the number, which is obtained by subtracting one from the PWM pulse number in one cycle of the output waveform. The difference between the duty pointer upper limit register RPMPTR1 and the duty pointer reload register RPRPTR1 is obtained by the comparator COMP1-1. Based on the compare match between duty pointer upper limit register RPMPTR1 and the duty pointer reload register RPRPTR1, the setting value of the duty pointer reload register RPRPTR1 is reloaded. The duty pointer reload register RPRPTR1 stores the reload value of the duty pointer register RPCPTR1. The duty buffer register RPDTBR1 stores the read data (i.e., the duty value) from the duty value RAM 251, which corresponds to the address shown in the duty pointer register RPCPTR1. The stored value in the duty buffer register RPDTBR1 provides a new duty value of the PWM pulse, which is formed in the PWM controller 254. The output value of the PWM period register RPPWCR1 and the output value of the PWM counter RPTCNT1 are compared by the comparator COMP1-2. Based on the compare match between the output value of the PWM period register RPPWCR1 and the output of the PWM counter RPTCNT1, the RAM access request of "1" becomes a high level. Thus, the output of the duty buffer register RPDTBR1 is uploaded to the duty compare register RPDTCR1 via the AND gate AND1-1.

A PWM counter period is set in the PWM period register RPPWCR1 by the CPU 16. Any value as an initial value can be written in the PWM counter RPTCNT1. The PWM counter RPTCNT1 counts up from a set value as an initial value. The output value of the PWM counter RPTCNT1 is transmitted to the comparator COMP1-2 and the comparator COMP1-3. The comparator COMP1-2 compares the output value of the PWM period register RPPWCR1 and the output value of the PWM counter RPTCNT1, so that the RAM access request of "1" becomes a high level according to the compare match. The event counter RPECNT1 counts up at every period of the PWM counter based on the output of the comparator COMP1-2. The duty comparison register RPDTCR1 stores the current duty value of the PWM pulse. The value of the RPGTOUT of "1" becomes a high level when the value of the PWM counter RPTCNT1 is logical value of "0." The comparator COMP1-3 compares the output value of the PWM counter RPTCNT1 and the output value of the duty comparison register RPDTCR1. The value of the RPGTOUT of "1" becomes a low level according to compare match between the output value of the PWM counter RPTCNT1 and the output value of the duty comparison register RPDTCR1. The event comparison register RPECR1 stores an event occurrence count value. The comparator COMP1-4 compares the output value of the event comparison register RPECR1 and the output value of the event counter RPECNT1. When the event occurrence is permitted by the RPGT event creation permission register RPICR, the A/D conversion activation trigger of "1" and the event comparison interruption of "1"

are asserted according to compare match between the output value of the event comparison register RPECR1 and the output value of the event counter RPECNT1.

Here, each register can be reset according to a reset signal.

Figure 6:
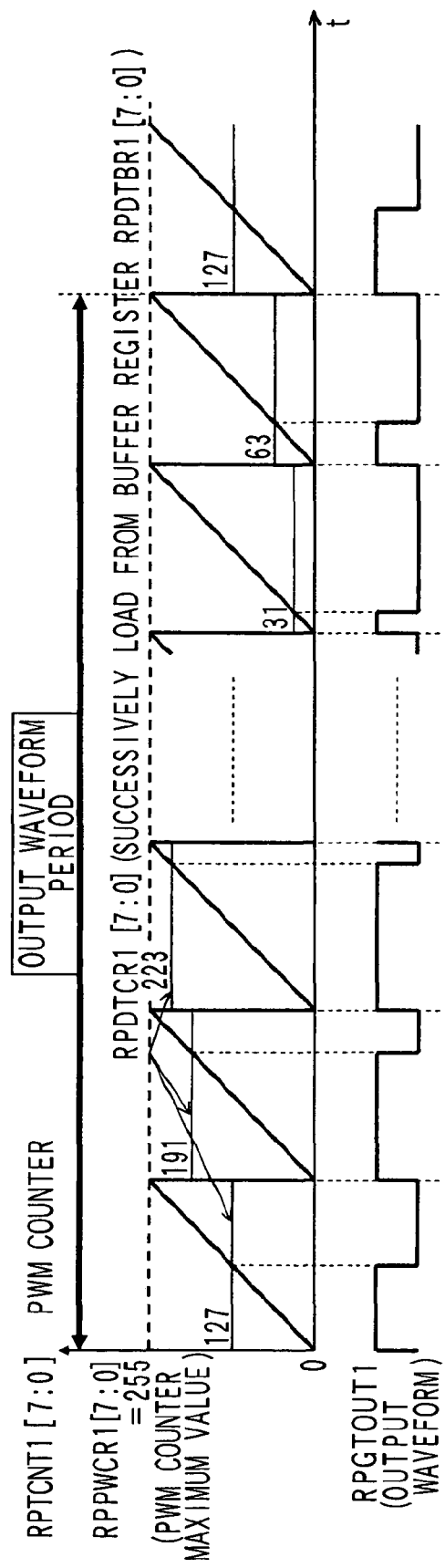
FIG. 6 is a diagram showing an operation waveform in the main part of the microcomputer.

FIG. 6 shows a relationship between the duty buffer register RPDTBR1 and the output waveform (i.e., RPGTOUT). The horizontal axis t represents time.

The PWM counter period of RPPWCR1 of "[7:0]=255" is set in the PWM period register RPPWCR1 although the period is not limited to this value. The PWM counter RPTCNT1 counts up, and when the output value of the PWM counter RPTCNT1 coincides with the output value (i.e., 255) of the PWM period register RPPWCR1, the output value of the PWM counter RPTCNT1 becomes a logical value of "0," and the PWM pulse (i.e., RPGTOUT1) becomes a high level. The PWM pulse (i.e., RPGTOUT1) becomes a low level according to compare match between the output value of the PWM counter RPTCNT1 and the output value of the duty comparison register RPDTCR1. Specifically, the unit waveform of the PWM pulse is generated according to the compare match between the duty value of the duty value RAM 251 and the output value of the PWM counter RPTCNT1. A new duty value is downloaded from the duty value RAM 251 at every compare match. Accordingly, the duty value of the PWM pulse can be changed in chronological order. Thus, the duty value corresponding to the output value (i.e., the value indicated by the pointer) of the duty pointer register RPCPTR1 is loaded from the duty value RAM 251 to the duty buffer register RPDTBR1. Further, the duty value is written in the duty comparison register RPDTCR1 via the AND gate AND1-1. Thus, the duty value can be compared with the output value of the PWM counter RPTCNT1. Here, when the value loaded from the duty value RAM 251 to the duty buffer register RPDTBR1 and written in the duty comparison register RPDTCR1 via the AND gate AND1-1 is updated between "127," "191," "223," . . . , "31," "63," and "127," the duty of the PWM pulse (i.e., PRGTOUT1) is changed in chronological order in accordance with the value.

Figure 3:
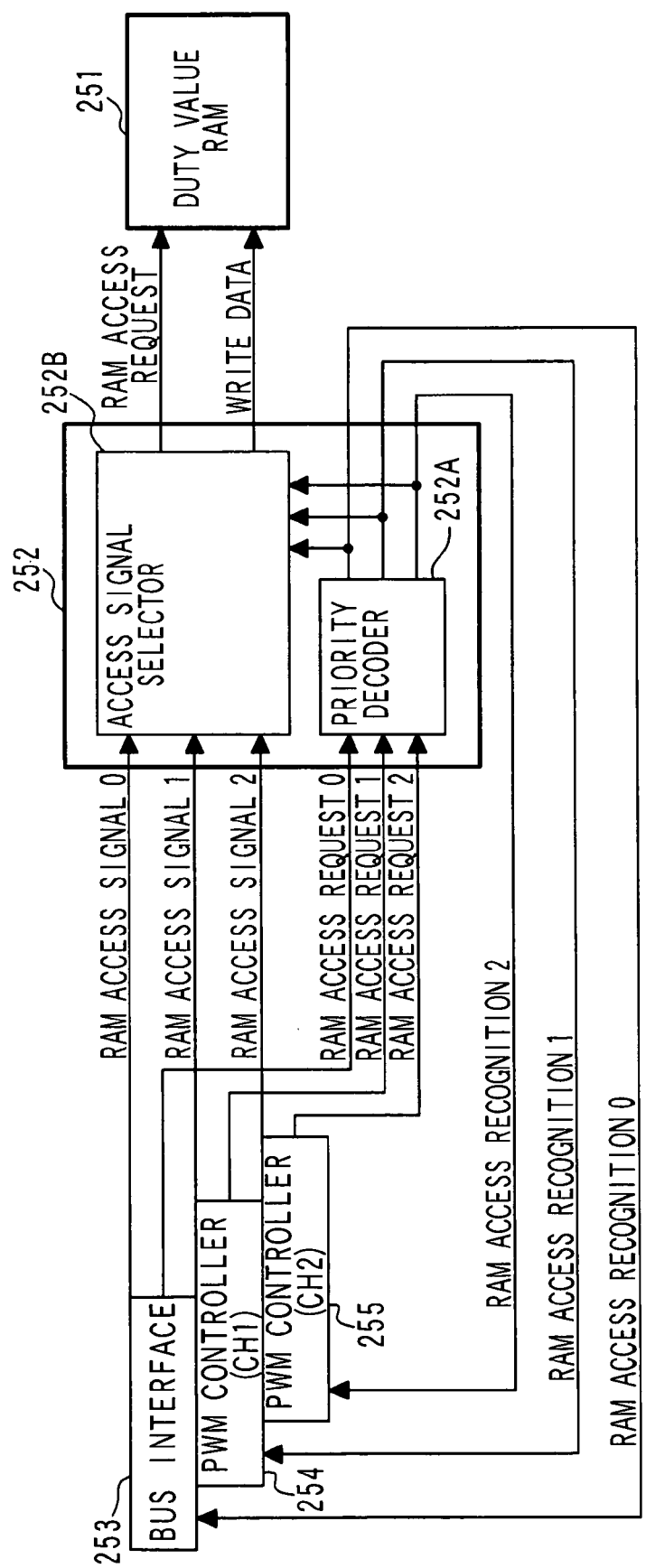
FIG. 3 is a block diagram showing an arbiter in FIGS. 1 and 2.

FIG. 3 shows an example construction of the arbiter 252.

As shown in FIG. 3, the arbiter 252 includes a priority decoder 252A and an access signal selector 252B. The priority decoder 252A determines the priority and assigns RAM access recognition to one of the bus interface 253 and the PWM controllers 254, 255 when multiple RAM access requests from the bus interface 253 and the PWM controllers 254, 255 compete against each other. The method for determining the priority is, for example, (1) to memorize the priority in a hard ware preliminary, (2) to determine the priority by using soft ware statically and variably, (3) to determine the priority by using soft ware dynamically and variably, and (4) to reduce the priority accessed at the last time to the lowest, or the like. The RAM access signal (e.g., address or the like) corresponding to the channel, which is recognized to access, is selected by the access signal selector 252A, and transmitted to the duty value RAM 251.

Figure 7:
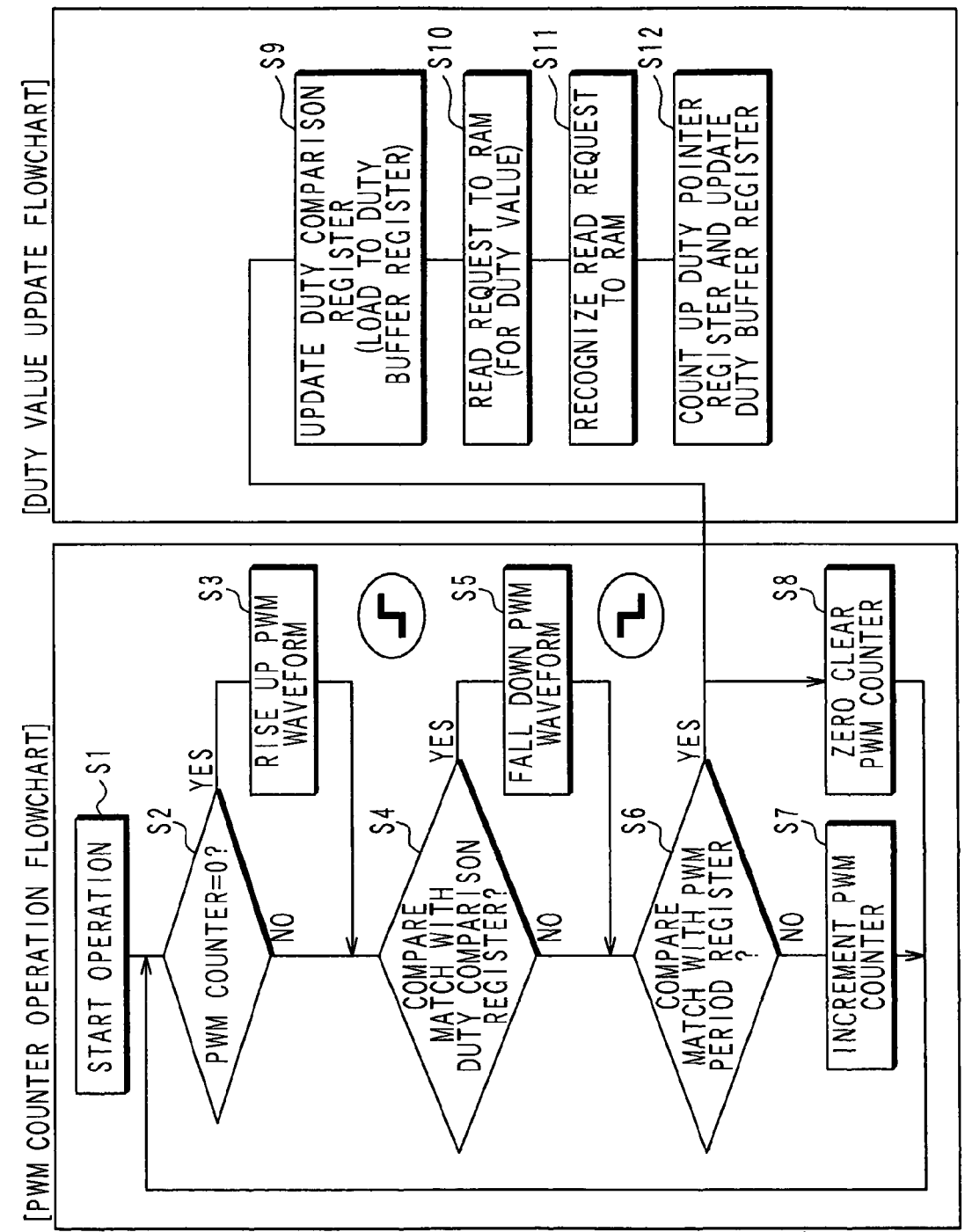
FIG. 7 is a flowchart showing operation of the main part of the microcomputer.

FIG. 7 shows a flowchart of PWM pulse generation in the microcomputer 100 having the above construction.

When the bit OP1 is set to be the logical value of "1" by the CPU 16, the PWM controller 254 is activated. When the bit OP2 is set to be the logical value of "1," the PWM controller 255 is activated. Here, in view of simple explanation, a case where the PWM controller 254 is activated when the bit OP1 is set to be the logical value of "1" by the CPU 16 will be explained. The PWM controller 254 is activated in Step S1. In Step S2, it is determined whether the output value of the PWM counter RPTCNT1 is the logical value of "0." In Step S3, the PWM waveform rises up when the output value of the PWM counter RPTCNT1 is the logical value of "0." When the output value of the PWM counter RPTCNT1 is the logical value of "1," compare match between the output value of the PWM counter RPTCNT1 and the output value of the duty comparison register RPDCR1 is performed in Step S4. In this comparison, when the output value of the PWM counter RPTCNT1 coincides with the output value of the duty comparison register RPDTCR1, the PWM waveform falls down in Step S5. Then, compare match between the output value of the PWM counter RPTCNT1 and the PWM period register RPPWCR1 is performed in Step S6. When the output value of the PWM counter RPTCNT1 does not coincide with the PWM period register RPPWCR1 the PWM counter RPTCNT1 is incremented by +1 in Step S7. Further, when the output value of the PWM counter RPTCNT1 coincides with the PWM period register RPPWCR1, the output of the PWM counter RPTCNT1 becomes the logical value of "0, " so that the duty value is updated in Step S9 to Step S12. Thus, the stored value of the duty buffer register RPDTBR1 is loaded to the duty comparison register RPDTCR1 so that the duty comparison register RPDTCR1 is updated in Step S9. In Step S10, read request for the duty value RAM 251 is performed in order to obtain a new duty value. When the read request is recognized in Step S11, the duty pointer register RPCPTR1 counts up. Thus, the duty buffer register RPDTBR1 is updated by the duty value newly read from the duty value RAM 251 in Step S12.

In the above description, it is explained that the PWM controller 254 is activated by setting the bit OP1 to be the logical value of "1" with using the CPU 16. When the PWM controller 255 is activated by setting the bit OP 2 to be the logical value of "1" with using the CPU 16, the PWM pulse is generated in the PWM controller 255 similar to the above description. Here, it is possible to activate both of the PWM controllers 254, 255 at the same time.

Figure 5:
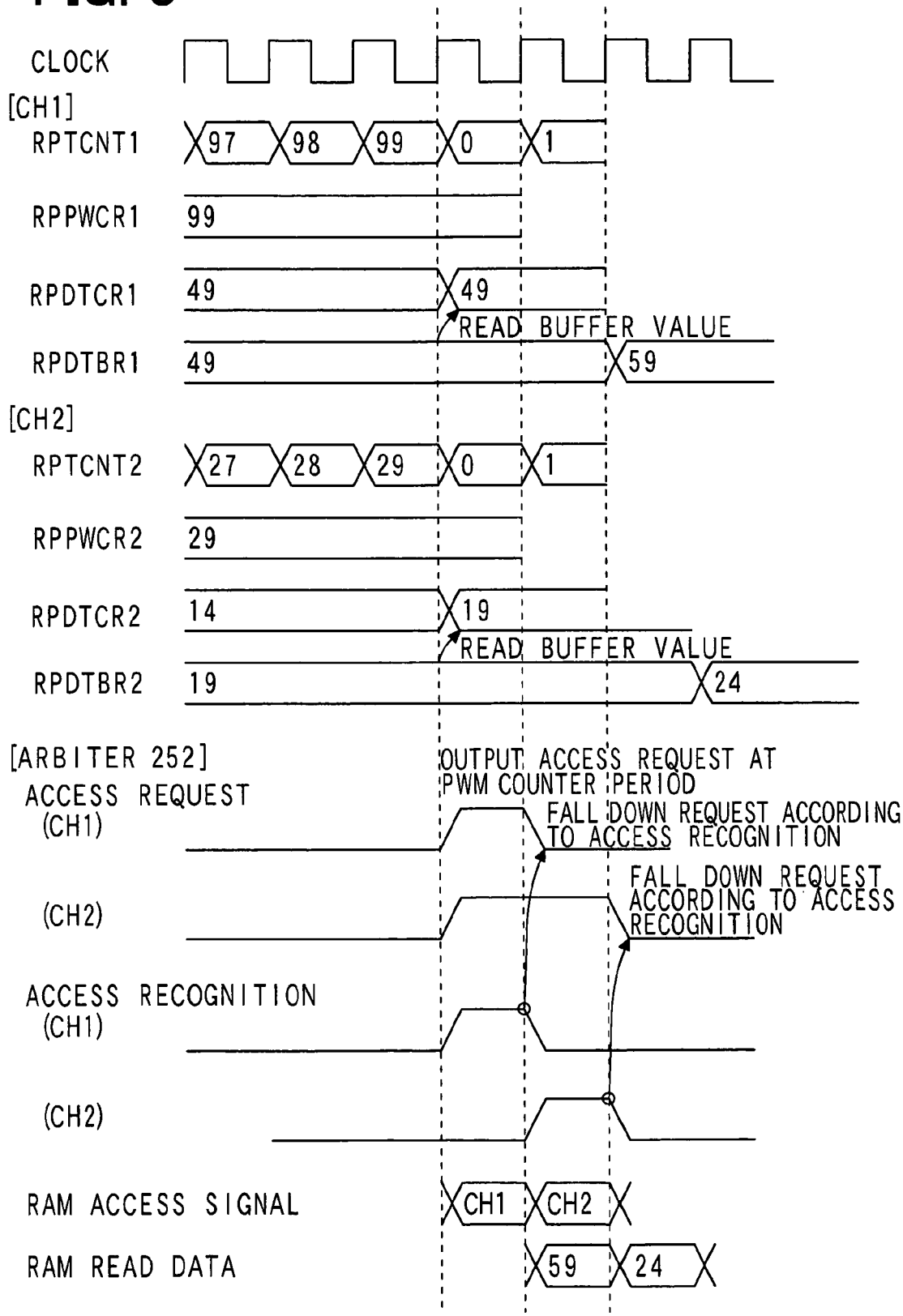
FIG. 5 is a timing chart showing operation of the main part of the microcomputer.

FIG. 5 shows a case where both of the PWM controllers 254, 255 are operated, so that access from the PWM controller 254 to the duty value RAM 251 competes with access from the PWM controller 255 to the duty value RAM 251. In FIG. 5, CH1 represents the PWM controller 254, and CH2 represents the PWM controller 255. When access from the PWM controller 254 to the duty value RAM 251 competes with access from the PWM controller 255 to the duty value RAM 25, access adjustment is performed as follows. When the access request from CH1 and access request from CH2 are performed at the same time, the arbiter 252 executes access control as access adjustment based on a predetermined priority order. In the example shown in FIG. 5, CH1 has the priority order higher than CH2. As a result, the access recognition of CH2 is delayed by one clock. However, access of CH1 to the duty value RAM 251 and access of CH2 to the duty value RAM 251 are apparently performed at the same time. A predetermined duty value is read out from the RAM 251 to each of CH1 and CH2, and duty control is performed based on the duty value.

Figure 8:
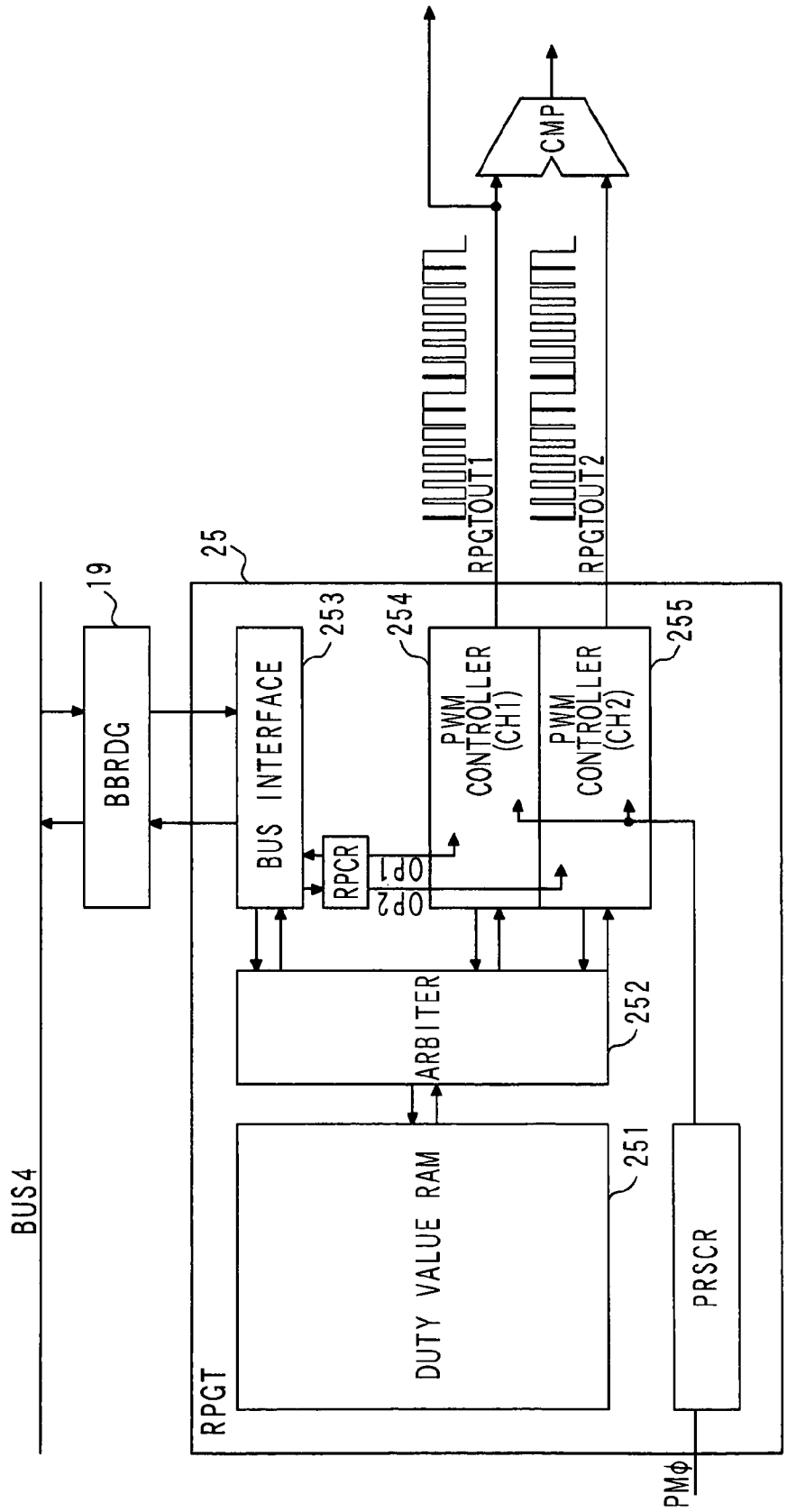
FIG. 8 is a block diagram showing another main part of the microcomputer.

Thus, by utilizing apparent simultaneous access of CH1 and CH2 to the duty value RAM 251, generation of the PWM pulse can be duplicated. For example, the same duty value pattern is doubly set in a first memory region and a second memory region in the duty value RAM 251. The second memory region is different from the first memory region. The first memory region corresponds to the PWM controller 254 (CH1), and the second memory region corresponds to the PWM controller 255 (CH2). Each of the PWM controller 254 (CH1) and the PWM controller 255 (CH2) generates the same PWM pulse. In this case, as shown in FIG. 8, the PWM output (i.e., RPGTOUT1) of the PWM controller 254 (CH1) and the PWM output (i.e., RPGTOUT2) of the PWM controller 255 (CH2) are compared with the comparator CMP. When they do not coincide with each other, it is considered that the PWM controller 254 (CH1) and/or the PWM controller 255 (CH2) may function abnormally. For example, when the PWM output (RPGTOUT1) of the PWM controller 254 (CH1) is used for control of a user system, reliability of the PWM output (RPGTOUT1) is improved. The comparator CMP may be arranged in the micro computer 100. Alternatively, the comparator CMP may be arranged in the user system, on which the micro computer 100 is mounted.

Figure 11:
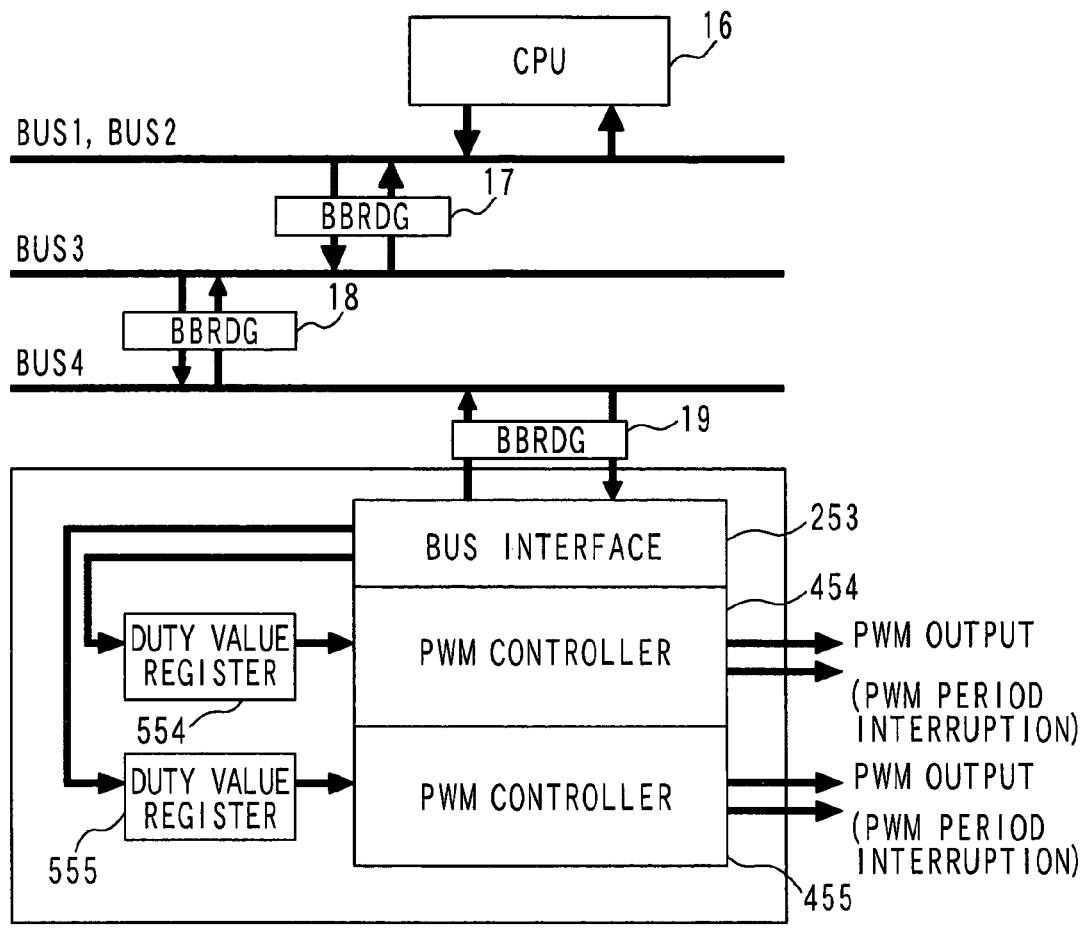
FIG. 11 is a block diagram showing a main part of a microcomputer as a comparison of the main part of the microcomputer.

FIG. 11 shows an example constitution as a comparison object of the RPGT 25.

Figure 12:
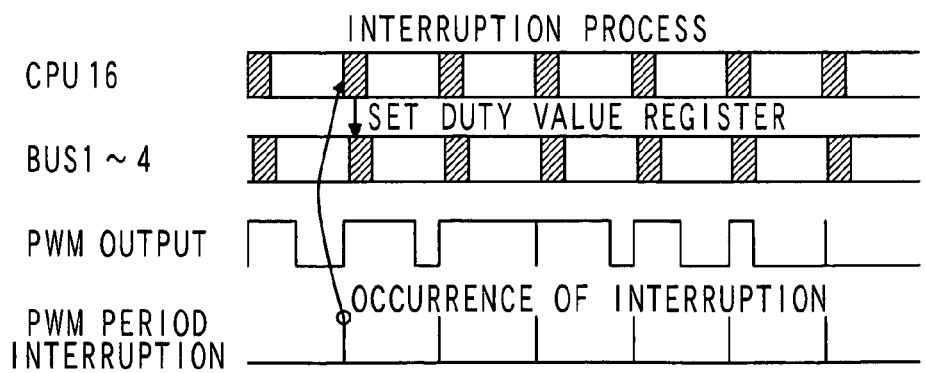
FIG. 12 is a timing chart showing operation of the main part in FIG. 11.

In FIG. 11, duty value registers 554, 555 for setting the duty value are formed. The PWM controller 454, 455 generates the PWM pulse according to a setting value of the corresponding duty value register 554, 555. When a stored value in the duty value register 554, 555 is updated, the duty of the PWM pulse is changed. The update of the stored value of the duty value register 554, 555 is performed by the CPU 16 via the CPU buses BUS1, BUS2, the inside bus BUS3 and the periphery bus BUS4. Specifically, as shown in FIG. 12, the PWM controller 454, 455 generates the interruption in the CPU 16 for setting the duty value register at each time when the duty of the PWM pulse is changed. In the interruption process for setting the duty value register, the CPU 16 writes a new duty value in the duty value register 554, 555 via the CPU buses BUS1, BUS2, the inside bus BUS3 and the periphery bus BUS4. In this case, a temporally trap caused by jam of bus traffic in the CPU 16 may occur in the writing operation from the CPU 16. When the trap occurs, the CPU 16 does not perform PWM control sufficiently, and thereby, the normal PWM pulse is not output. Further, it is necessary to generate the interruption in the CPU 16 in order to update the duty value. If difficulty derived from, for example, soft ware error of the interruption signal or break of a hard ware line occurs, the normal PWM pulse may not be output.

The update of the stored value in the duty value register 554, 555 may be performed by the DMAC. In this case, it is necessary for the DMAC to obtain the right of use the bus arranged in a pass from the DMAC to the duty value register 554, 555. Thus, similar to the construction shown in FIG. 11, the difficulty caused by jam of the bus traffic may arise.

On the other hand, in the construction shown in FIGS. 1 to 3, when the micro computer 100 is initialized, the duty value pattern can be set in the duty value RAM 251. Thus, without being influenced by the jam of bus traffic of the CPU 16, generation of the temporally trap in the writing function in the CPU 16 is surely prevented. Thus, the normal PWM pulse waveform is output always, and reliability of the PWM pulse is improved. Further, no interruption signal for updating the duty of the PWM pulse is necessary. Accordingly, there is no difficulty derived from, for example, soft ware error of the interruption signal or break of a hard ware line.

Further, in the construction shown in FIG. 11, it is necessary to update the duty value of the duty value register 554, 555 frequently according to the interruption process in the CPU 16 in real time. Therefore, when it is confirmed by the soft ware whether the update is performed normally, the PWM pulse generated may be delayed.

Figure 4:
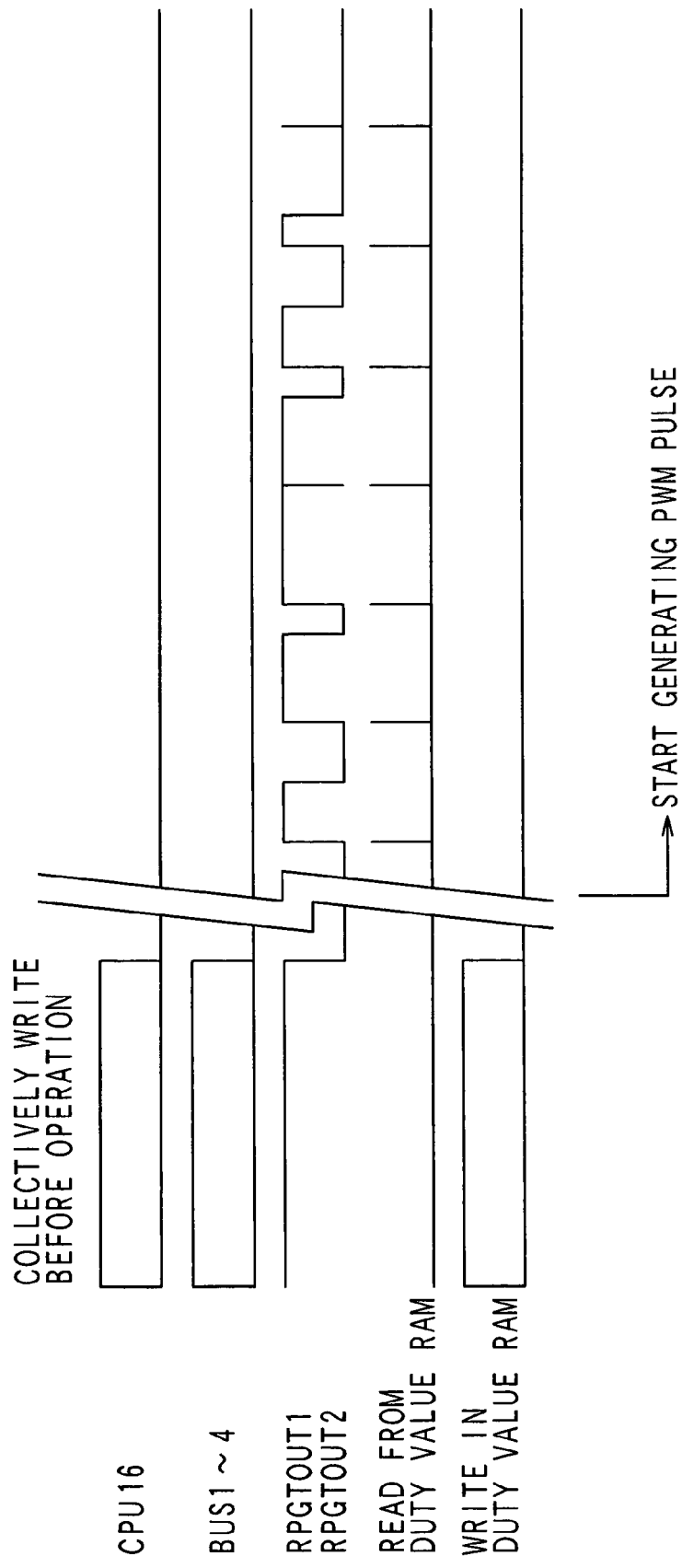
FIG. 4 is a timing chart showing operation of the main part of the microcomputer.

On the other hand, in the construction shown in FIGS. 1 to 3, before the PWM pulse generation starts, for example, when the micro computer 100 is initialized, the duty value pattern can be set in the duty value RAM 251, as shown in FIG. 4. Thus, before the PWM pulse is generated, it is confirmed whether the duty value pattern setting is performed normally. This provides advantage to improve the reliability of the PWM pulse.

According to the above construction, the following effects are obtained.

(1) Without being affected by the jam of bus traffic in the CPU, occurrence of the temporally trap in the writing function in the CPU is surely prevented. Thus, the normal PWM pulse waveform is output always. Thus, the reliability of the PWM pulse is improved.

(2) Without being affected by the jam of bus traffic in the CPU, occurrence of the temporally trap in the writing function in the CPU is surely prevented. Thus, the normal PWM pulse waveform is output always, so that the reliability is improved.

(3) Since the micro computer 100 does not provide the interruption signal to the CPU 16 in order to update the duty. Accordingly, difficulty derived from, for example, soft ware error of the interruption signal or break of a hard ware line is reduced.

(4) Before the PWM pulse generation starts, for example, the duty value pattern can be set in the duty value RAM 251 when the microcomputer 100 is initialized. Accordingly, it is confirmed whether the duty value pattern is set normally before the PWM pulse is generated.

(5) When the PWM controllers 254, 255 are multiplexed, the comparator CMP easily detects abnormal output waveform. Thus, the reliability of the user system is improved.

Figure 10:
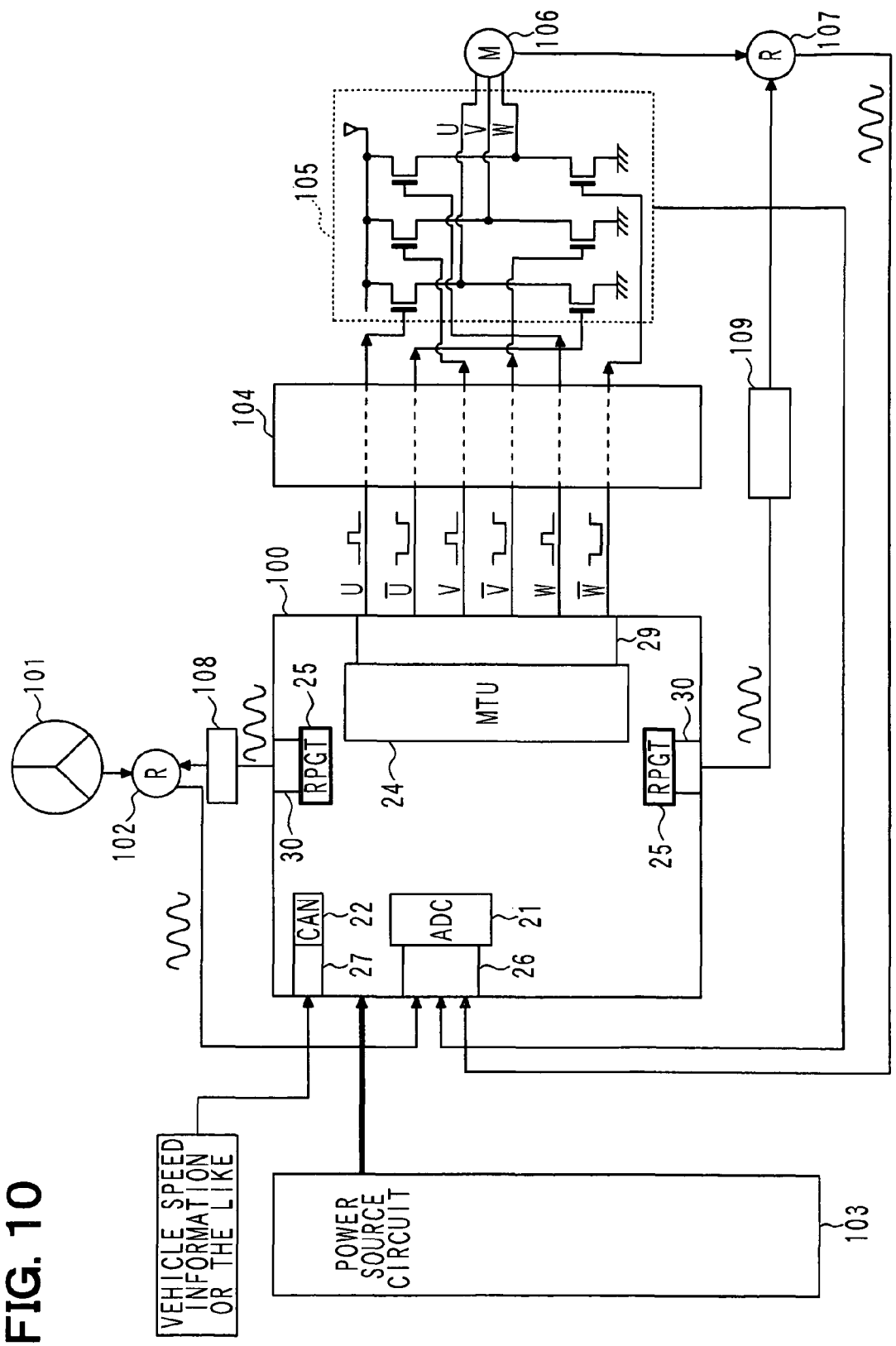
FIG. 10 is a block diagram showing a main part of a user system having the above microcomputer.

FIG. 10 shows application example of the micro computer 100.

The micro computer 100 is mounted on the user system. The user system is an example of an external device. The user system is, for example, a power steering control device for a vehicle although the user system is not limited to the power steering control device. The vehicle on which the user system is mounted includes a steering wheel 101 and a motor 106 for actively providing a rudder angle to wheels of the vehicle. The steering wheel 101 includes a resolver sensor 102 for detecting an axial angle of the steering wheel 101 and a circuit such as a CR filter 108 for outputting an excitation signal to the resolver sensor 102. The motor 106 includes a resolver sensor 107 for detecting an axial angle of the motor 106 and a circuit 109 such as a CR filter circuit for outputting an excitation signal to the resolver sensor 107. Each resolver sensor 102, 107 includes a rotor and a stator. When an excitation AC signal (i.e., excitation analog signal) is input in the rotor, an AV signal having an axial angle as a parameter is obtained in the stator. Supply of the excitation AC signal to each resolver sensor 102, 107 is performed such that the PWM pulse as a digital rectangular wave is supplied to the circuit 108, 109 such as the CR filter from the RPFT 25 via the port 30 and the external terminal. Further, a sine wave as an analog signal is generated by the circuit 108, 109 such as the CR filter in accordance with the PWM pulse. Then, the sine wave is supplied as the excitation AC signal. Since the micro computer 100 includes two PWM controllers 454, 455 corresponding to two channels, the PWM controller 454 corresponds to the resolver sensor 102, and the PWM controller 455 corresponds to the resolver sensor 107. The detection signal (i.e., AC signal) of the resolver sensor 102 is retrieved in the ADC 21 via the port 26. After the detection signal is converted to a digital signal, the digital signal is used in a calculation process for controlling rotation operation of the motor 106. The calculation process is performed by the CPU 16. The calculation process result is supplied to the driver 104 via the MTU 24 and the port 29. The result signal is amplified in the driver 104, and then, the result signal is supplied to the driving circuit 105, which is arranged on a latter step. The driving circuit 105 is formed from a power MOS transistor. Based on an output signal of the driver 104, rotation operation of the motor 106 is performed. In this case, the axial angle of the motor 106 is detected by the resolver sensor 107. The detected axial angle is retrieved to the ADC 21 via the external terminal and the port 26. Then, the angle signal is converted to a digital signal in the ADC 21. Then, the digital signal is input into the CPU 16. Thus, the actual motor axial angle information is feed-backed to the CPU 16, so that the rotation operation of the motor 106 is corrected. Here, vehicle speed information is retrieved via the port 27, and then, the information is used for the calculation process in the CPU 16. The power source circuit 103 is arranged, and a power source voltage for operation is supplied from the power source circuit 103 to the micro computer 100. The micro computer 100, the motor, the resolver sensor, the circuit such as the CR filter, and a circuit connecting to an external element such as a power source circuit may be directly coupled with each other. Alternatively, they may be coupled with each other via other circuits (not shown).

In the above construction, the micro computer 100 having effects shown in (1) to (5) is used. Thus, the reliability of the steering wheel control is improved.

In a modification of the above embodiment, for example, the micro computer further includes an error correction function in the duty value RAM 251. The error correction function is, for example, ECC (error check and correct) or parity bit. By providing the error correction function, an read error can be corrected even if the read error occurs in the duty value RAM 251. Thus, the reliability of the PWM pulse generation is improved.

One aspect of the present disclosure will be explained simply as follows.

The CPU and the PWM timer are included in the micro computer. The PWM timer includes the RAM for setting the duty value pattern of the PWM pulse and the PWM controller for generating the PWM pulse. The PWM controller includes the PWM counter, and the unit waveform of the PWM pulse is generated by the compare match between the duty value in the RAM and the output value of the POWM counter. A new duty value is loaded at every compare match from the RAM without functioning the CPU. The duty value of the PWM pulse is capable of changing in chronological order. The above construction provides to avoid influence of bus traffic jam of the CPU when the PWM pulse is generated and further to avoid generation of a temporally trap in a writing function in the CPU.

The effects of the present disclosure will be explained simply as follows.

A technique for improving reliability of PWM pulse generation by the micro computer is presented.

The micro computer (100) according to one aspect of the present disclosure includes a CPU (16) for executing a predetermined calculation process and a PWM timer (25) for generating the PWM pulse. The PWM timer includes a RAM (251) for setting the duty value pattern of the PWM pulse and a PWM controller (254, 255) for generating the PWM pulse. The PWM controller includes a PWM counter (RPTCNT1, RPTCNT2) for counting up from a predetermined value as an initial value. The unit waveform of the PWM pulse is generated by the compare match between the duty value in the RAM and the output value of the PWM counter. The duty value is loaded at every compare match from the RAM without functioning the CPU. Thus, the duty value of the PWM pulse is changed in chronological order.

In the above construction, generation of the PWM pulse is not affected by influence of bus traffic jam of the CPU, so that generation of a temporally trap in writing function of the CPU is surely prevented. Thus, a normal PWM pulse waveform is output always. The reliability of the PWM pulse is improved.

The micro computer (100) according to another aspect of the present disclosure includes a CPU (16) for executing a predetermined calculation process and a PWM timer (25) for generating the PWM pulse. The PWM pulse is capable of being supplied to an external device. The PWM timer includes a RAM (251) for setting the duty value pattern of the PWM pulse, a plurality of PWM controllers (254, 255) for generating the PWM pulse, and a port (30) for outputting the PWM pulse generated in the multiple PWM controllers to external device. Each PWM controller in the multiple PWM controller includes a PWM counter (RPTCNT1, RPTCNT2) for counting up from a predetermined value as an initial value.

The unit waveform of the PWM pulse is generated by the compare match between the duty value in the RAM and the output value of the PWM counter. The duty value is loaded at every compare match from the RAM without functioning the CPU. Thus, the duty value of the PWM pulse is changed in chronological order. In the above construction, generation of the PWM pulse is not affected by influence of bus traffic jam of the CPU, so that generation of a temporally trap in writing function of the CPU is surely prevented. Thus, a normal PWM pulse waveform is output always. The reliability of the PWM pulse is improved.

The PWM timer includes a control register (RPCR), which stores a bit for instructing operation start and operation stop of the PWM controller. The control register is configured to be capable of writing in the CPU.

The PWM controller includes a PWM period register (RPPWCR1, RPPWCR2) for setting a period of the PWM counter. The PWM counter is cleared according to compare match with the output of the PWM period register.

The PWM controller includes a duty comparison register (RPDTCR1, RPDTCR2) for storing the current duty value. The PWM pulse output from the PWM controller becomes a high level when the output value of the PWM counter is a logical value of "0." The PWM pulse output becomes a low level according to compare match between the output value of the PWM counter and the output value of the duty comparison register.

The PWM controller includes a duty pointer register (RPCPTR1, RPCPTR2) for setting an address providing read start instruction in the RAM. According to the output value of the duty pointer register, the address for providing read start instruction in the RAM.

The PWM controller includes a duty pointer upper limit register (RPMPTR1, RPMPTR2) for setting an upper limit of the duty pointer register and a duty pointer load register (RPRPTR1, RPRPTR2) for setting a reload value of the duty pointer register. Based on compare match between the output value of the duty pointer register and the output value of the duty pointer upper limit register, the setting value of the duty pointer reload register is reloaded to the duty pointer register.

The PWM timer includes an arbiter (252) for adjusting competition of access request to the RAM from multiple PWM controllers.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A microcomputer comprising:
a CPU executing a predetermined calculation process; and
a PWM timer generating a PWM pulse,
wherein the PWM timer includes a RAM for storing a duty value of the PWM pulse and a PWM controller for generating the PWM pulse,
wherein the PWM controller includes a PWM counter for counting up from a predetermined value as an initial value,
wherein the PWM pulse has an unit waveform, which is generated based on comparison between the duty value in the RAM and an output value of the PWM counter, and
wherein the RAM outputs a new duty value at every comparison without functioning the CPU so that the duty value of the PWM pulse is changed in chronological order.

2. The microcomputer according to claim 1,
wherein the PWM timer further includes a control register, which stores a parameter for instructing start operation and stop operation of the PWM controller, and
wherein the CPU rewrites the parameter in the control register.

3. The microcomputer according to claim 1,
wherein the PWM controller further includes a PWM period register for setting a period of the PWM counter, and
wherein the output value of the PWM counter is set to be a logical value of "0" when the output value of the PWM counter coincides with an output value of the PWM period register.

4. The microcomputer according to claim 1,
wherein the PWM controller includes a duty comparison register for storing a current duty value,
wherein the PWM pulse output from the PWM controller is set to be a high level when the output value of the PWM counter is a logical value of "0," and
wherein the PWM pulse is set to be a low level when the output value of the PWM counter coincides with an output value of the duty comparison register.

5. The microcomputer according to claim 1,
wherein the PWM controller further includes a duty pointer register, which sets an address for providing read start instruction in the RAM, and
wherein the address for providing read start instruction in the RAM is specified according to an output value of the duty pointer register.

6. The microcomputer according to claim 5,
wherein the PWM controller further includes a duty pointer upper limit register for setting an upper limit of the duty pointer register and a duty pointer reload register for setting a reload value of the duty pointer register, and
wherein a setting value of the duty pointer reload register is reloaded to the duty pointer register based on comparison between the output value of the duty pointer register and an output value of the duty pointer upper limit register.

7. A microcomputer comprising:
a CPU executing a predetermined calculation process; and
a PWM timer generating a PWM pulse,
wherein the PWM timer includes a RAM for storing a duty value of the PWM pulse, a plurality of PWM controllers for generating the PWM pulse, and a port for outputting the PWM pulse generated by each PWM controller to an external circuit,
wherein each PWM controller includes a PWM counter for counting up from a predetermined value as an initial value,
wherein the PWM pulse has an unit waveform, which is generated based on comparison between the duty value of the RAM and an output value of the PWM counter, and
wherein the RAM outputs a new duty value at every comparison without functioning the CPU so that the duty value of the PWM pulse to be output to the external circuit is changed in chronological order.

8. The microcomputer according to claim 7,
wherein the PWM timer further includes a control register, which stores a parameter for instructing start operation and stop operation of the PWM controller, and
wherein the CPU rewrites the parameter in the control register.

9. The microcomputer according to claim 7,
wherein each PWM controller further includes a PWM period register for setting a period of the PWM counter, and
wherein the output value of the PWM counter is set to be a logical value of "0" when the output value of the PWM counter coincides with an output value of the PWM period register.

10. The microcomputer according to claim 7,
wherein each PWM controller includes a duty comparison register for storing a current duty value,
wherein the PWM pulse output from the PWM controller is set to be a high level when the output value of the PWM counter is a logical value of "0," and
wherein the PWM pulse is set to be a low level when the output value of the PWM counter coincides with an output value of the duty comparison register.

11. The microcomputer according to claim 7,
wherein each PWM controller further includes a duty pointer register, which sets an address for providing read start instruction in the RAM, and
wherein the address for providing read start instruction in the RAM is specified according to an output value of the duty pointer register.

12. The microcomputer according to claim 11,
wherein each PWM controller includes a duty pointer upper limit register for setting an upper limit of the duty pointer register and a duty pointer reload register for setting a reload value of the duty pointer register, and
wherein a setting value of the duty pointer reload register is reloaded to the duty pointer register based on comparison between the output value of the duty pointer register and an output value of the duty pointer upper limit register.

13. The microcomputer according to claim 11,
wherein the PWM timer includes an arbiter for adjusting competition according to a predetermined priority order when a plurality of access requests to the RAM from the plurality of PWM controllers occurs at the same time.

* * * * *